United States Patent [19]
Inagaki et al.

[11] Patent Number: 5,657,361
[45] Date of Patent: Aug. 12, 1997

[54] VARIANT FREQUENCY DETECTOR CIRCUIT

[75] Inventors: Yasukuni Inagaki; Hitoshi Takahashi, both of Kasugai, Japan

[73] Assignee: Fujitsu Limited, Kawasaki, Japan

[21] Appl. No.: 523,602

[22] Filed: Sep. 5, 1995

[30] Foreign Application Priority Data

Sep. 6, 1994 [JP] Japan .................. 6-212926
Sep. 19, 1994 [JP] Japan .................. 6-223783

[51] Int. Cl.⁶ .................. H03K 9/06; H03K 21/38
[52] U.S. Cl. .................. 377/39; 327/48
[58] Field of Search .................. 327/39, 42, 43, 327/44, 47, 48, 49; 377/39, 28, 114

[56] References Cited

U.S. PATENT DOCUMENTS

| | | | |
|---|---|---|---|
| 4,025,868 | 5/1977 | Miki et al. | 327/48 |
| 4,158,129 | 6/1979 | Baumgartner | 377/39 |
| 4,232,267 | 11/1980 | Hanajima et al. | 327/48 |
| 4,276,468 | 6/1981 | Nagamoto et al. | 377/39 |
| 4,517,684 | 5/1985 | Fennel | 327/48 |
| 4,780,895 | 10/1988 | Paul | 327/42 |
| 5,155,748 | 10/1992 | Rabii | 377/39 |
| 5,221,906 | 6/1993 | Hayashi et al. | 377/39 |
| 5,440,604 | 8/1995 | De Subijana et al. | 377/39 |
| 5,521,952 | 5/1996 | Morishima | 377/39 |
| 5,528,183 | 6/1996 | Maturi et al. | 327/48 |

*Primary Examiner*—Timothy P. Callahan
*Assistant Examiner*—My-Trang Nu Ton
*Attorney, Agent, or Firm*—Armstrong, Westerman, Hattori, McLeland & Naughton

[57] ABSTRACT

A detector circuit for detecting abnormalities in the oscillation frequency of a clock signal, includes a counter and a comparator. The counter is supplied with a reference clock signal, and counts the number of pulses of the reference clock signal to output a signal indicative of the count value. In response to the clock signal, the counter clears the count value. The comparator compares the count value of the counter with a specified value stored in its register, and generates a detection signal indicating whether the frequency of the clock signal is within expected limits, based on the comparison result.

14 Claims, 11 Drawing Sheets

VARIANT FREQUENCY DETECTOR CIRCUIT

BACKGROUND OF THE INVENTION

1. Field of the Invention

The present invention relates in general to a frequency detector, and in particular, to a component of a semiconductor integrated circuit that detects abnormalities in the frequency of the semiconductor's system clock.

2. Description of the Related Art

To synchronize the timing of microcontrollers or other peripheral devices in a microprocessor, a pulse or signal waveform generator is typically used to generate precisely timed voltage pulses at a fixed frequency and amplitude. Industry standard microprocessors can have clock inputs driven by a crystal, an LC tuned circuit, an external clock source or a system clock incorporated in the microcontroller. Often, the system clock in the microcontroller is connected to external components, such as a quartz oscillator and a capacitor, via external terminals of the microcontroller. The frequency of the system clock signal is determined by the quartz oscillator.

Maintaining precise control of the operating environment with respect to the clock circuitry is extremely important. For example, should the quartz oscillator or any capacitor connected to the external terminals of the microcontroller be exposed to moisture or foreign material, additional capacitance could cause variations to occur in the oscillatory frequency of the system clock. This in turn could result in device timing instability and microcontroller time shifting.

Deviations in the timing of digital circuitry beyond allowable tolerances can be a contributing factor in the misapplication of a high or low potential signal to a particular digital device. Should a low potential be asserted to a device when a high potential is expected, device malfunction could result. Fluctuations in oscillation frequency often preclude predetermined device control procedures and programming. For the above reasons, microcontrollers manufactured today require variant oscillation detecting circuitry designed to detect unexpected fluctuations in the oscillation frequency of the system clock.

FIG. 1 is an illustration of a frequency detector typically used in microcontroller circuitry. The microcontroller 110 is equipped with an oscillation circuit 111 for generating a system or operational clock signal CLK0. The oscillation circuit 111 includes a resistor 111a and two inverters 111b and 111c. The resistor 111a and the inverter 111b are connected in parallel. The oscillation circuit 111 is connected to external terminals T1 and T2 of the microcontroller 110. The external terminals T1 and T2 are grounded via capacitors C1 and C2, respectively. A quartz oscillator XTL0 is provided between the terminals T1 and T2.

The oscillation frequency of the system clock signal CLK0 is determined by the resistance and capacitance of the oscillation circuit 111 and the quartz oscillator XTL0. The system clock signal CLK0 is supplied from the inverter 111c of the oscillation circuit 111 to an edge detector 114 via an internal circuit (not shown) and a frequency divider 113. The frequency divider 113 divides the frequency of the system clock signal CLK0 with a predetermined dividing ratio to generate a pulse signal CL1, as shown in the timing chart of FIG. 2. The pulse signal CL1 is supplied to the edge detector 114. The edge detector 114 detects the rising edge of the pulse signal CL1 and outputs a pulse signal CLK1 high for a predetermined period starting with the rise of pulse signal CL1.

The microcontroller 110 further includes a reference oscillator 116, a frequency divider 117 and a counter 115. The reference oscillator 116 is a ring-type oscillator circuit and supplies the frequency divider 117 with a reference clock signal CL3 at a predetermined frequency. The frequency divider 117 divides the frequency of the reference clock signal CL3 by a predetermined ratio to generate a reference clock signal CLK2, as shown in FIG. 2.

The counter 115 counts the number of reference clock signals CLK2 and uses the pulse signal CLK1 as a reset or clear signal to detect variations in the frequency of the system clock signal CLK0. Specifically, the counter 115 counts the number of pulses of the reference clock signal CLK2, by reference to the leading edge of the signal CLK2. The counter 115 also clears a current count value in response to a leading edge of the pulse signal CLK1 (i.e., sets the counting value to zero). In response to a trailing edge of the pulse signal CLK1, the counter 115 drops the clear signal to restart the counting operations. When the count value of the clock signal CLK2 reaches a predetermined value, the counter 115 outputs a high-level detection signal E1 indicating that the oscillation frequency of the signal CLK0 at an unexpected level. If the frequency of the system clock signal CLK0 is reduced, for example, the period of the pulse signal CLK1 increases, and the timing for clearing the counter 115 is delayed. The count value of the reference clock signal CLK2, in this situation, is more likely to reach the specified value. Counter 115 generates a high potential detection signal E1 to initialize the internal circuits and external peripheral devices. Signal E1, output high from the counter 115, initializes each of these devices.

When the oscillation frequency of the system clock signal CLK0 is within normal operating limits, the period of the pulse signal CLK1 will also be within normal operating limits. The counter 115 consequently can receive the pulse signal CLK1 and clear the count value before a target value signal CLK2 reaches its target value. Consequently, the counter 115 will not output detection signal E1 high as long as the oscillation frequency of the system clock signal CLK0 is within expected limits.

Because the system clock CLK0 is generated by oscillation circuit 111, and because the reference clock signal CL3 is generated by the reference oscillator 116, the system clock signal CLK0 in conventional frequency detectors is most often not synchronized with the reference clock signal CL3. In conventional detectors, should the falling edge of the pulse signal CLK1 coincide with the rising edge of the reference clock signal CLK2, the counter 115 would receive two signals CLK1 and CLK2. When this happens, the counter 115 often generates "counter noise" on the signal E1, as shown in FIG. 2, even though the count value has not reached a target or specified value. Because most detectors regard this noise as a high-level detection signal E1, the noise often causes time shifting to occur with the microcontroller 110.

Moreover, should the voltage supply to the microcontroller 110 drop for any reason, clock signal CLK0 may be obscured or even omitted in conventional detectors, due to an externally generated noise. Without the pulse signal CLK0, the period during which pulse signal CL1 is high increases, further delaying the next high pulse of signal CLK1. With a delay in the pulse signal CLK1, the reference clock signal CLK2 will cycle for a predetermined period, causing the counter 115 to output detection signal E1 high. Unintended output of detection signal E1 high can result in time shifting by the microcontroller 110.

Occasionally, microcontroller 110 comes equipped with a different type of frequency detector that can detect an increase in the oscillation frequency of the system clock signal CLK0. This type detector is substantially the same as described above and illustrated in FIG. 1, except that the detector uses a counter, much like counter 115, to count the pulses of the system clock signal CLK0. This type of counter tracks the pulses of the system clock signal CLK0, and clears the count value at a predetermined time interval. When the count value of the system clock signal CLK0 reaches a particular value, the counter outputs detection signal E1 high to indicate unacceptable deviation in the frequency of the system clock signal CLK0.

The higher oscillation frequencies of system clock signal CLK0 causes its period to decrease and count value to increase before it can be reset or cleared. The clock's count value is typically cleared before reaching the particular value, as long as the counter receives the system clock signal CLK0 at the proper frequency.

Microcontrollers and their peripheral devices typically control products having various timing requirements. To meet these requirements, the frequency of the system clock signal should be adjusted whenever necessary to the proper frequency. Moreover, variations in the operating frequency are often necessary.

For example, in order to reduce power consumption for some electronic devices, the frequency of the system clock signal will often change. When an internal circuit is in a standby state, the frequency of the system clock signal may be reduced to decrease an operation speed of the internal circuit. When fully powered, the internal circuit often requires an increase in the frequency of the system clock in order to effect high speed circuit operation. Microcontroller power consumption, therefore, may be reduced by decreasing the internal circuit's operational speed to that of a standby state.

One method commonly used to change system frequency is to selectively use two external quartz oscillators. A second commonly used method is to change the frequency of a clock signal input from an external circuit.

Unfortunately, conventional frequency detectors are often unable to distinguish unexpected variations in a system clock signal from normal variations. This often happens because the system clock count values and the clock reset period are often constant values and do not account for changes in the oscillation frequency of the clock.

SUMMARY OF THE INVENTION

Accordingly, it is a primary object of the present invention to provide a variant frequency detector circuit that is applicable to a plurality of oscillation frequencies.

A secondary object of the present invention is to provide a variant frequency detector circuit which prevents counter noise from being generated in the output signal.

A third object of the present invention is to provide a variant frequency detector circuit which accurately and reliably detects abnormalities in the frequency of oscillation signal.

A fourth object of the present invention is to provide a variant frequency detector circuit which operates without being affected by externally supplied noise.

To achieve the foregoing and other objects and in accordance with the purpose of the present invention, improved variant frequency detector circuits are provided, for detecting abnormalities in the frequency of a clock signal to be detected.

The variant frequency detector circuit according to the present invention includes a counter 1 and a comparator 2, as shown in FIG. 3. The counter 1 is supplied with a reference clock signal CLK2 from a reference oscillator 3, and counts the number of pulses of the reference clock signal CLK2 to output a signal indicative of the count value N1. In response to a clock signal CLK0 to be detected, the counter 1 clears the count value N1. The comparator 2 is provided with a memory circuit 4 for storing a specified value. The comparator 2 compares the count value N1 with the specified value to generate a detection signal ERR indicating whether the frequency of the clock signal CLK0 is within expected limits.

Another type of the variant frequency detector circuit according to the present invention includes a counter 5 and a clear signal generator 6, as shown in FIG. 4. The counter 5 is supplied with a reference clock signal CLK2 from a reference oscillator 7 and with a clear signal CLR1 from the clear signal generator 6. The counter 54 starts to count the number of pulses of the reference clock signal CLK2 in response to an inactive clear signal CLR1, and stops the counting operation to clear the count value in response to an active clear signal CLR1. When the count value reaches a predetermined value, the counter 5 outputs a detection signal S1 indicating that the frequency of a clock signal CLK0 to be detected is not within expected limits. The clear signal generator 6 for generating the clear signal CLR1 is supplied with the reference clock signal CLK2 and with a pulse signal CLK1 produced by a pulse generator 8 from the clock signal CLK0. The clear signal CLR1 is set active, when a first edge of a pulse of the reference clock signal CLK2 is synchronized with a trailing edge of a pulse of the pulse signal CLK1.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF PREFERRED EMBODIMENTS

First Embodiment

Figure 1:
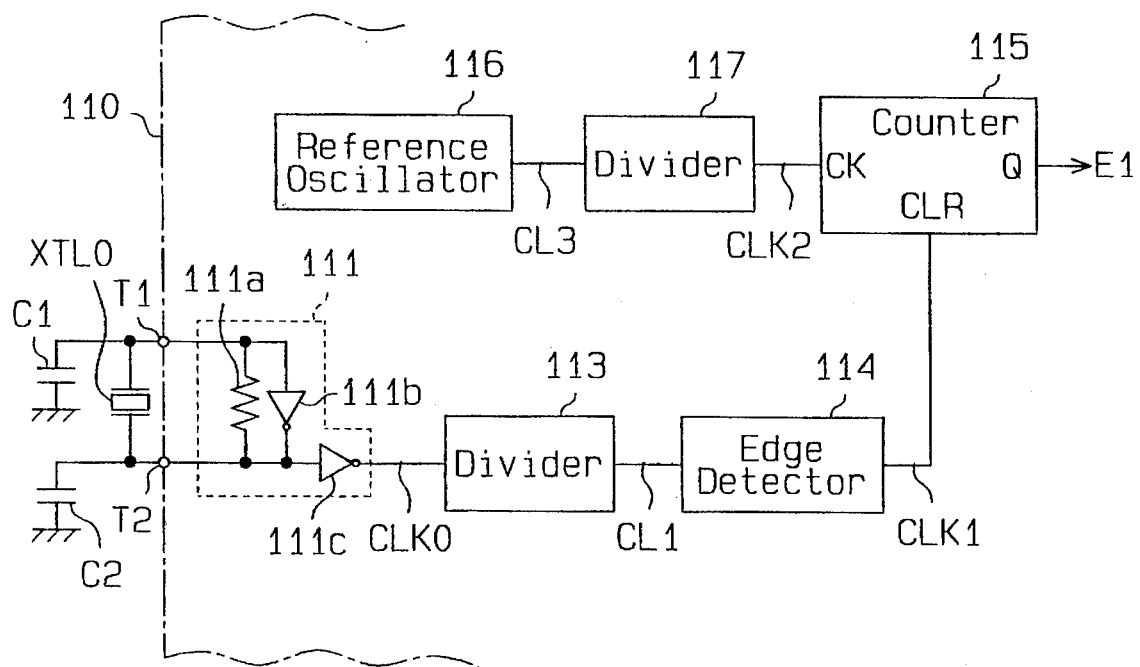
FIG. 1 is a block circuit diagram showing a part of a typical frequency detector for detecting abnormalities in signal frequency.
Figure 2:
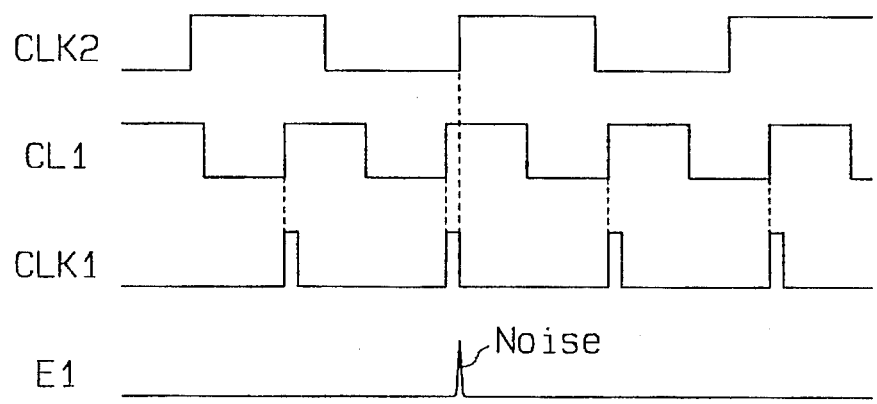
FIG. 2 is a timing chart of operations of the frequency detector shown in FIG. 1.
Figure 3:
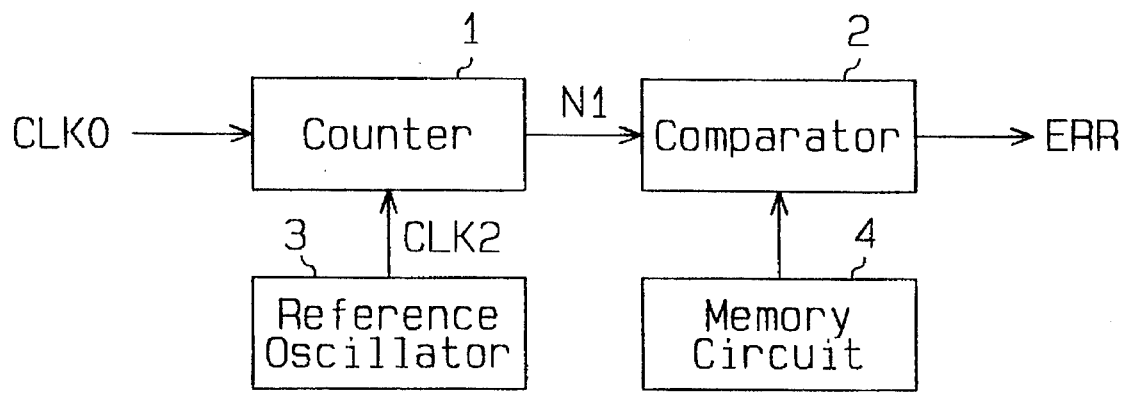
FIGS. 3 and 4 are schematic block diagrams showing the essential elements of the variant frequency detector circuits according to the present invention.
Figure 4:
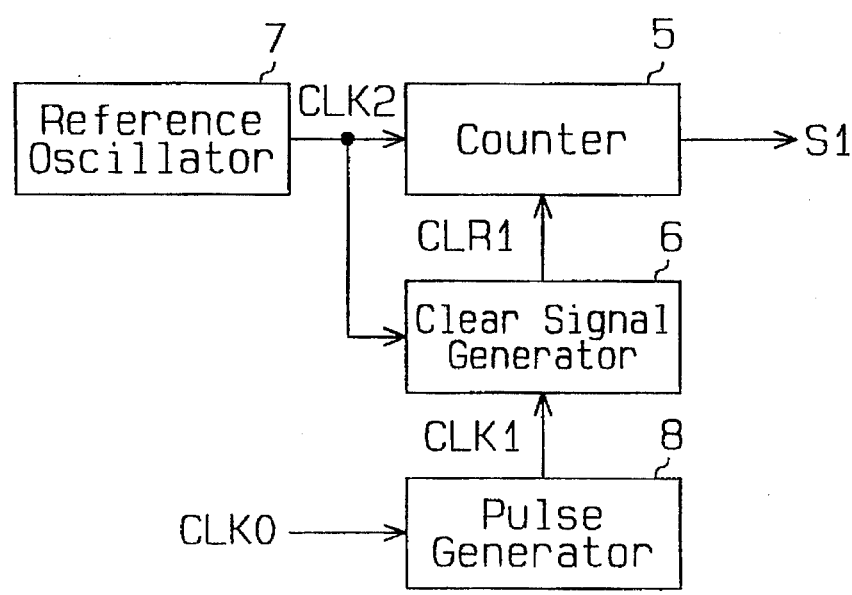

A microcontroller according to a first embodiment of the present invention will now be described with reference to FIGS. 5 through 13. A microcontroller 200 on a chip, shown in FIG. 5, includes an oscillation circuit 221, a variant frequency detector circuit or abnormal oscillation detecting circuit 222, a reset controller 223, a CPU 224, a ROM 225, a RAM 226, a peripheral circuit 227 and a clock controller 229. These circuit components 223, 224, 225, 226, 227 and 229 are connected to each other via a bus 228. The ROM 225 stores programs executed by the CPU 224 and the RAM 224 is a memory for temporarily storing data used by the CPU 224.

Figure 6:
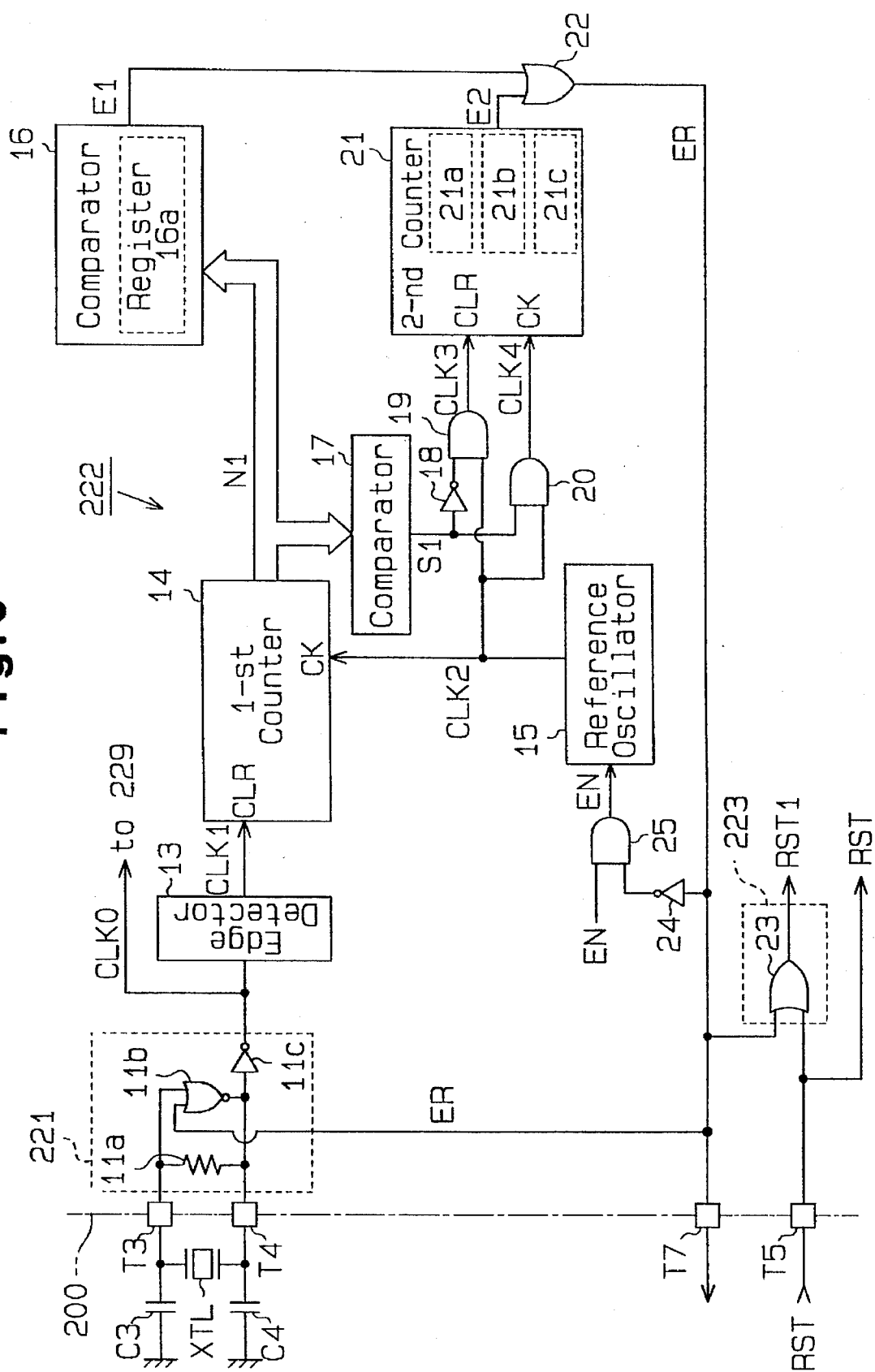
FIG. 6 is a circuit diagram showing a variant frequency detector circuit of the first embodiment.

FIG. 6 shows a detailed circuit configuration of the oscillation circuit 221 and the variant frequency detector circuit 222. The oscillation circuit 221 includes a resistor 11a, a NOR gate 11b and an inverter 11c. The resistor 11a and the NOR gate 11b are connected in parallel and are connected to external terminals T3 and T4 of the microcontroller 200. The external terminals T3 and T4 are connected to capacitors C3 and C4 whose one end are grounded, respectively. A quartz oscillator XTL is provided between the external terminals T3 and T4.

The oscillation circuit 221 generates a system clock signal CLK0. The oscillation frequency of the system clock CLK0 is defined by resistance and capacitance values of the oscillation circuit 221 and the quartz oscillator XTL. The system clock CLK0 is output to the variant frequency detector circuit 222 and to the clock controller 229 via the inverter 11c.

Figure 5:
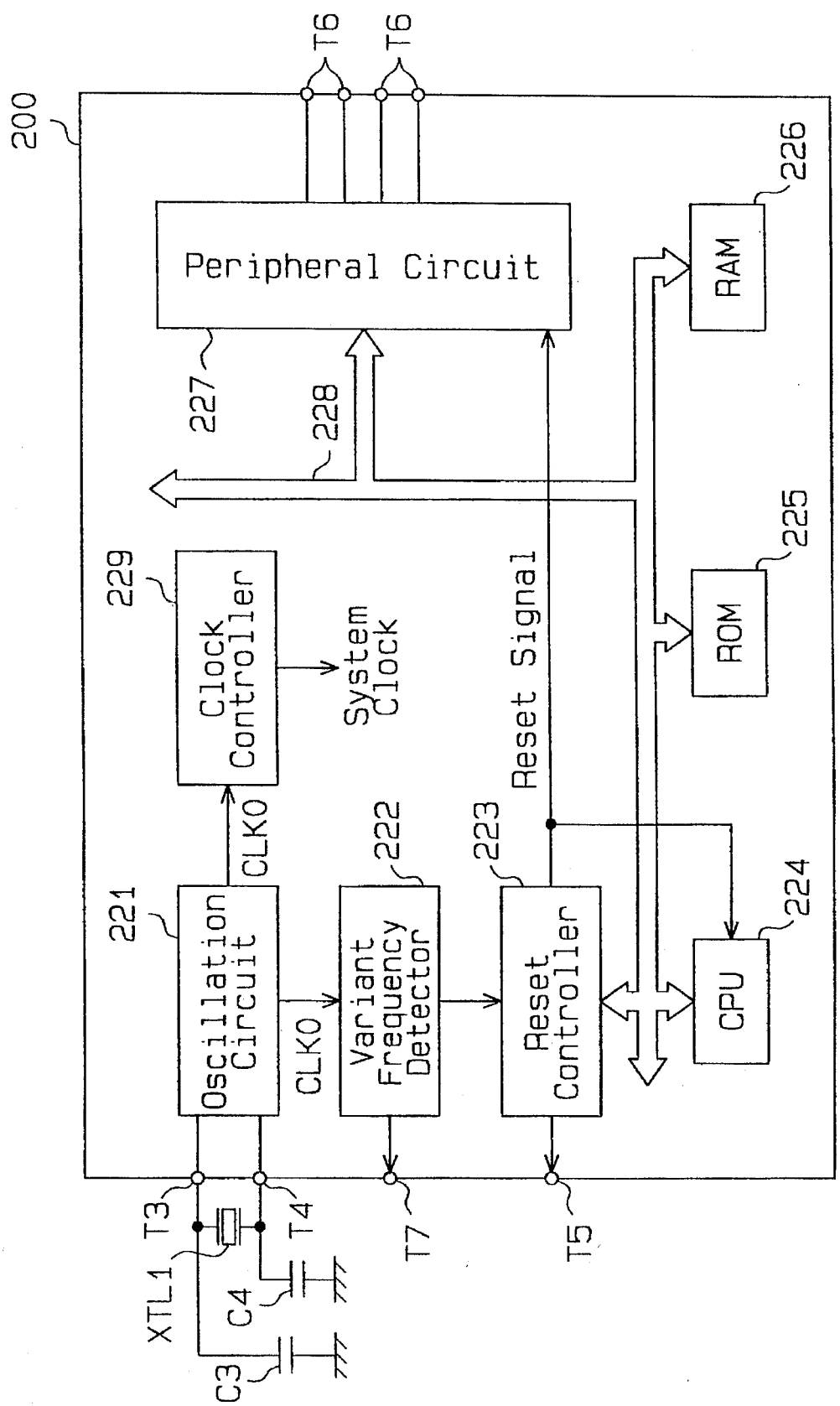
FIG. 5 is a block diagram showing a microcontroller according to a first embodiment of the present invention.

The clock controller 229 shown in FIG. 5 supplies the system clock CLK0 to the reset controller 223, the CPU 224, the ROM 225, the RAM 226 and the peripheral circuit 227. Based on the system clock CLK0, the CPU 224 reads a program from the ROM 225 and executes a process according to the program by using data stored in the RAM 226. The peripheral circuit 227 includes a timer and a counter (not shown). The peripheral circuit 227 operates, based on the system clock CLK0, to supply various signals to the outside therefrom via external terminals T6.

Figure 9:
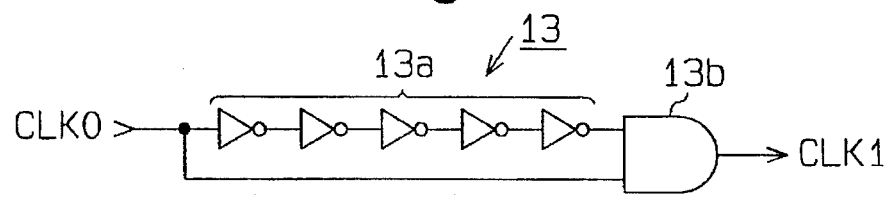
FIG. 9 is a circuit diagram showing an edge detecting circuit of the first embodiment.

The variant frequency detector circuit 222, shown in FIG. 6, receives the system clock CLK0 from the oscillation circuit 221 to detect abnormalities in the frequency of the system clock signal CLK0. The system clock CLK0 is input to an edge detector 13 of the frequency detector 222. As shown in FIG. 9, the edge detector 13 includes a delay circuit 13a and an AND gate 13b. The delay circuit 13a comprises an odd number of stages of inverters (five stages in this embodiment) connected in series. The AND gate 13b has a first input terminal for receiving the system clock CLK0 via the delay circuit 13a and a second input terminal for directly receiving the system clock CLK0.

The edge detector 13 generates a pulse signal CLK1 in response to the rising of the system clock CLK0 from low to high. Specifically, when the system clock CLK0 goes high, the pulse signal CLK1 goes high. Thereafter, the pulse signal CLK1 goes low after a delay time set by the delay circuit 13a from the change to high. The delay time is decided by the number of the inverters in the delay circuit 13a. The pulse signal CLK1 is supplied from the edge detector 13 to a first counter 14.

Figure 10:
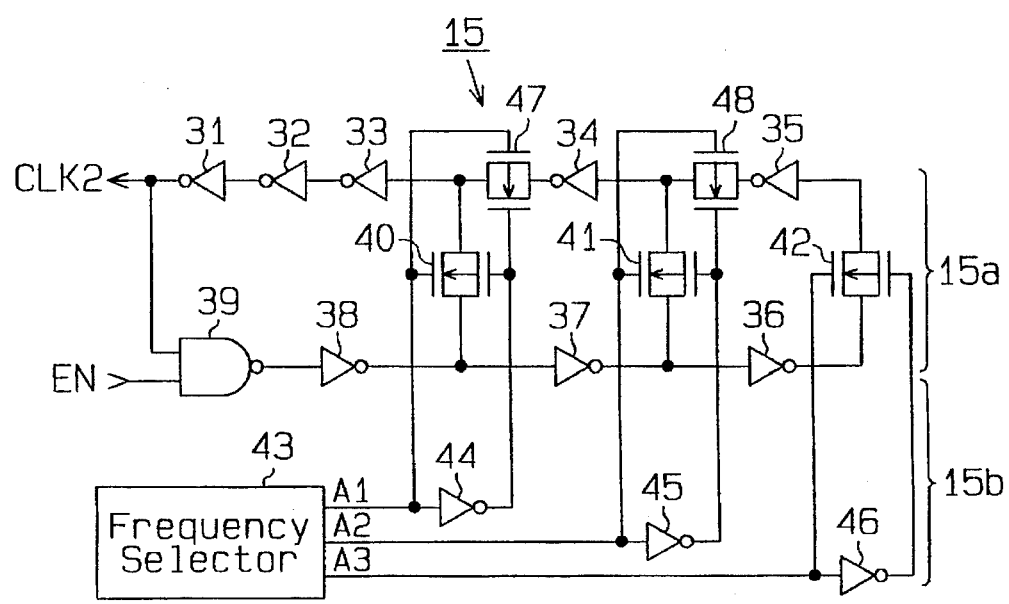
FIG. 10 is a circuit diagram showing a reference oscillator of the first embodiment.

The variant frequency detector circuit 222 includes a reference oscillator 15 which is a ring-type oscillation circuit. As shown in FIG. 10, the reference oscillator 15 includes an oscillation circuit section 15a and a frequency setting section 15b.

The oscillation circuit section 15a comprises eight inverters 31 through 38 connected in series and a NAND gate 39. The NAND gate 39 has a first input terminal connected to an output terminal of the inverter 31 and a second input terminal receiving an oscillation enabling signal EN. Upon receiving a high-level oscillation enabling signal EN, the oscillation circuit section 15a produces a reference clock signal CLK2 having a frequency defined by the inverters 31 through 38 and the NAND gate 39, at the output terminal of the inverter 31.

A first transfer gate 40 is connected between an input terminal of the inverter 33 and an output terminal of the inverter 38. A second transfer gate 41 is connected between an input terminal of the inverter 34 and an output terminal of the inverter 37. The inverter 35 and the inverter 36 are connected by a third transfer gate 42. The inverter 33 and the inverter 34 are connected by a fourth transfer gate 47. The inverter 34 and the inverter 35 are connected by a fifth transfer gate 48.

Each of the first through fifth transfer gates 40, 41, 42, 47 and 48 is composed of a P channel MOS transistor (hereinafter referred to as PMOS transistor) and an N channel MOS transistor (hereinafter referred to as NMOS transistor).

Either one transfer gate among the first through third transfer gates 40, 41 and 42 is turned on by the frequency setting section 15b and the other transfer gates are turned off. Either one of the fourth and fifth transfer gates 47 and 48 is turned on by the frequency setting section 15b and the other transfer gate is turned off. For example, when the second and fourth transfer gates 41 and 47 turn ON and when the first, third and fifth transfer gates 40, 42 and 48 turn OFF, the inverter 34 is connected to the inverter 37 by the second transfer gate 41. As a result, the oscillation circuit section 15a becomes a ring oscillation circuit formed by the inverters 31 through 34, 37 and 38 and the NAND gate 39. The frequency of the reference clock signal CLK2 is decided by those inverters 31 through 34, 37 and 38 and the NAND gate 39. In other words, the frequency of the reference clock signal CLK2 can be changed by selectively turning on the first through fifth transfer gates 40, 41, 42, 47 and 48.

The frequency setting section 15b includes a frequency selector 43 and three inverters 44 through 46. The frequency selector 43 is constructed of a flip-flop circuit for example, and serves as a frequency memorizing circuit. The frequency selector 43 stores data of a selected frequency, and sets any one of first through third selection signals A1, A2 and A3 output therefrom high, with reference to the frequency data.

The first selection signal A1 is supplied to a gate of the NMOS transistor of the first transfer gate 40 and a gate of the PMOS transistor of the fourth transfer gate 47. The first selection signal A1 is also supplied to a gate of the PMOS transistor of the first transfer gate 40 and a gate of the NMOS transistor of the fourth transfer gate 47 via an inverter 44. Accordingly, the first transfer gate 40 is turned on and the fourth transfer gate 47 is turned off by a high-level first selection signal A1.

The second selection signal A2 is supplied to a gate of the NMOS transistor of the second transfer gate 41 and a gate of the PMOS transistor of the fifth transfer gate 48. The second selection signal A2 is also supplied to a gate of the PMOS transistor of the second transfer gate 41 and a gate of the NMOS transistor of the fifth transfer gate 48 via an inverter 45. Accordingly, the second transfer gate 41 is turned on and the fifth transfer gate 48 is turned off by a high-level second selection signal A2.

The third selection signal A3 is supplied to a gate of the NMOS transistor of the third transfer gate 42, and is also supplied to a gate of the PMOS transistor of the third transfer gate 42 via an inverter 46. Accordingly, the third transfer gate 42 is turned on by a high-level third selection signal A3.

The frequency selector 43 receives data used for selecting either one of the first through third selection signals A1, A2 and A3, from the CPU 224. The CPU 224 selects a frequency to be used in accordance with the use of the microcontroller 200 and outputs data regarding the selected frequency to the frequency selector 43. The frequency selector 43 stores the frequency data supplied from the CPU 224 and controls the switching of the first through fifth transfer gates 40, 41, 42, 47 and 48 based on that data. The oscillation circuit section 15a outputs the reference clock signal CLK2 at the frequency corresponding to the frequency data from the CPU 224. The reference clock signal CLK2 is supplied to the first counter 14 shown in FIG. 6. The frequency detector circuit 222 includes the first counter 14 and a second counter 21.

Figure 11:
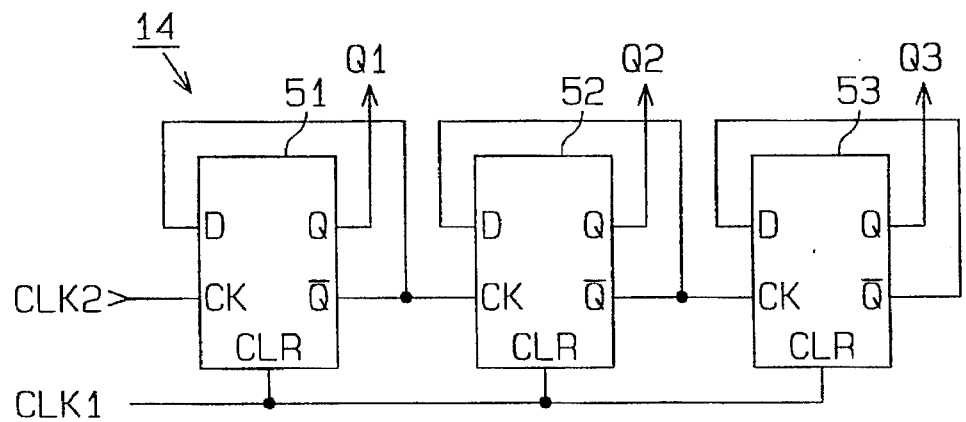
FIG. 11 is a circuit diagram showing a first counter of the first embodiment.

The first counter 14 detects whether or not the oscillation frequency of the system clock signal CLK0 is abnormally low. FIG. 11 shows the circuit configuration of the first counter 14. The first counter 14 includes first through third flip-flop circuits 51, 52, and 53. The first counter 14 receives the reference clock signal CLK2. The number of pulses of the reference clock signal CLK2 is counted by the first through third flip-flop circuits 51, 52 and 53. The count value N1 by the first counter 14 is output from the respective flip-flops 51, 52 and 53 as three bit signals Q1 through Q3.

Each of the first through third flip-flop circuits 51, 52 and 53 receives the pulse signal CLK1 from the edge detector 13 at its clear input terminal. In response to the pulse signal CLK1, the first counter 14 clears the current count value N1. That is, the first counter 14 counts the number of pulses of the reference clock signal CLK2 and outputs the signals Q1 through Q3 corresponding to the count value N1. In response to a high-level pulse signal CKL1, the first counter 14 outputs all of the signals Q1 through Q3 low.

Figure 12:
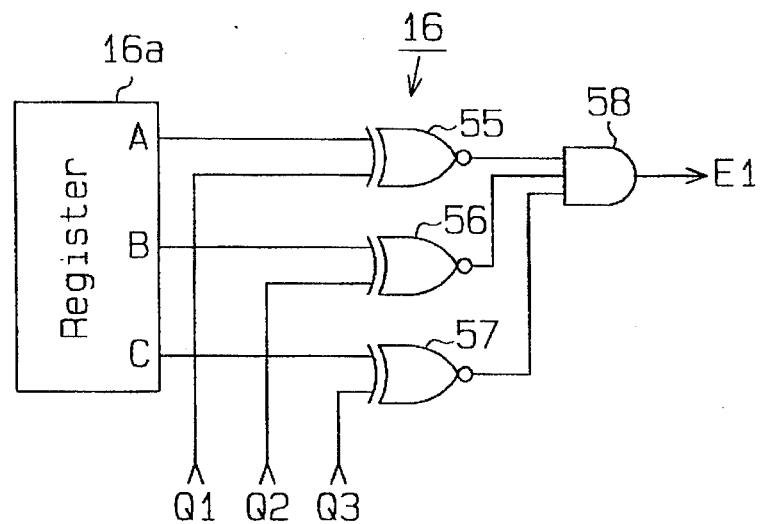
FIG. 12 is a circuit diagram showing a first comparator of the first embodiment.

The signals Q1 through Q3 indicating the count value N1 are supplied to a first comparator 16 and a second comparator 17. FIG. 12 shows the circuit configuration of the first comparator 16. The first comparator 16 includes a register 16a, three exclusive-NOR gates 55, 56 and 57 and an AND gate 58. The register 16a is constructed of a flip-flop circuit for example. The register 16a memorizes a first specified value set by the CPU 224. The first comparator 16 compares the specified value with the count value N1 represented by the signals Q1 through Q3. When the count value N1 is equal to the first specified value, the first comparator 16 outputs a first detection signal E1 high. When the count value N1 does not coincide with the first specified value, the comparator 16 outputs the first detection signal E1 low.

The second comparator 17 is constructed of a multi-input NOR gate for example, and compares the count value N1 with a value "0". When the count value N1 is equal to "0", the second comparator 17 outputs a signal S1 high. When the count value N1 is not "0", the comparator 17 outputs the signal S1 low.

As shown in FIG. 6, the signal S1 output from the second comparator 17 is supplied to an AND gate 19 via an inverter 18 as well as to an AND gate 20. Each of the AND gates 19 and 20 receives the reference clock signal CLK2. The second counter 21 has a clear input terminal CLR connected with an output terminal of the AND gate 19 and a clock input terminal CK connected with an output terminal of the AND gate 20. Accordingly, with the signal S1 low (i.e., when the count value N1 is not "0"), the AND gate 19 outputs the reference clock signal CLK2 from the reference oscillator 15 to the clear input terminal CLR as a clear signal CLK3. With the signal S1 high (i.e., when the count value N1 is "0"), the AND gate 20 outputs the reference clock signal CLK2 to the clock input terminal CK as a count clock signal CLK4.

Figure 13:
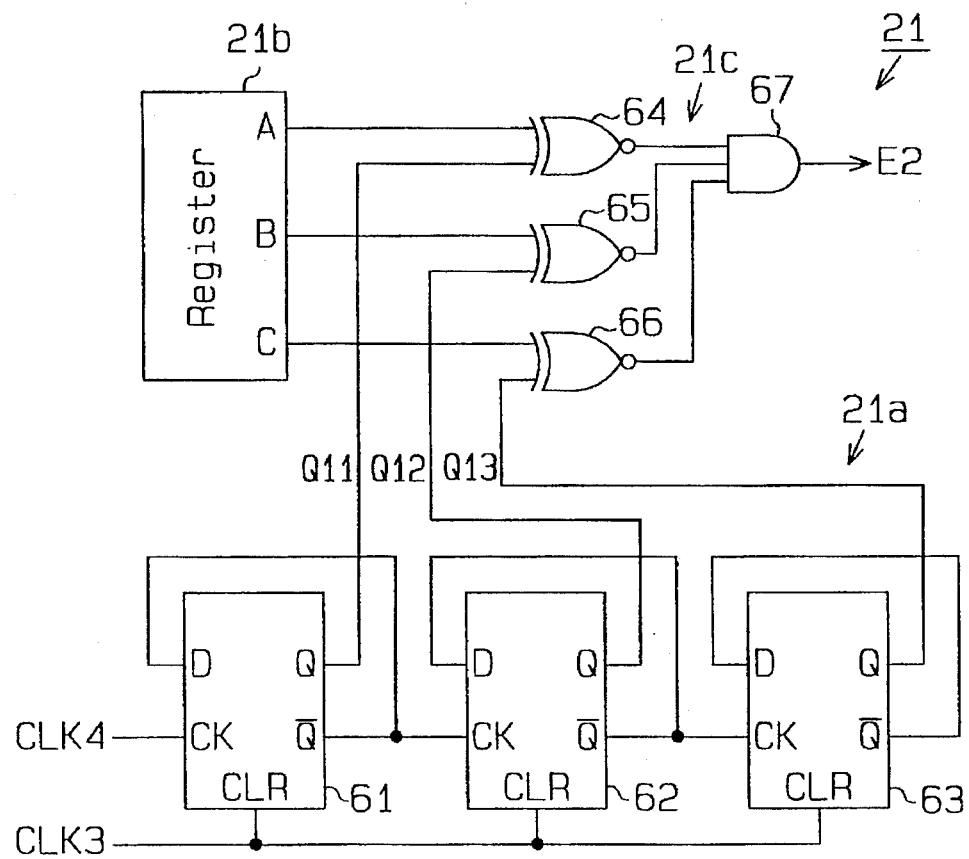
FIG. 13 is a circuit diagram showing a second counter of the first embodiment.

As shown in FIG. 13, the second counter 21 includes a main counter section 21a, a register 21b and a comparator section 21c.

The main counter section 21a is provided to determine whether or not an increase in the frequency of the system clock CLK0 is proper. The main counter section 21a includes first through third flip-flop circuits 61, 62 and 63 to count the number of pulses of the count clock signal CLK4. The obtained count value N2 is output from the flip-flops 61, 62 and 63 as three bit signals Q11, Q12 and Q13. Each of the flip-flops 61, 62 and 63 has a clear input terminal for receiving the clear signal CLK3 from the AND gate 19. In response to the clear signal CLK3, the main counter section 21a clears the current count value N2.

The register 21b memorizes a second specified value set by the CPU 224. The comparator section 21c is composed of three exclusive-NOR circuits 64, 65 and 66 and an AND gate 67. The comparator section 21c compares the second specified value with the count value N2 represented by the signals Q11 through Q13. When the count value N2 coincides with the second specified value, the comparator section 21c outputs a second detection signal E2 high. When the count value N2 does not coincide with the second specified value, the comparator section 21c outputs the second detection signal E2 low.

As shown in FIG. 6, the frequency detector circuit 222 includes an OR gate 22 receiving the first and second detection signals E1 and E2. When at least one of the first and second detection signals E1 and E2 is set high, the OR gate 22 outputs a third detection signal ER high. With both the first and second detection signals E1 and E2 low, the OR gate 22 outputs the third detection signal ER low.

The frequency detector circuit 222 further includes an AND gate 25 which has a first input terminal receiving the oscillation enabling signal EN from the CPU 224 and a second input terminal receiving the third detection signal ER from the OR gate 22 via an inverter 24. The oscillation enabling signal EN is generated by the CPU 224. When the signal EN is set high, the reference oscillator 15 is enabled to oscillate.

Accordingly, with the third detection signal ER low, the AND gate 25 supplies the oscillation enabling signal EN from the CPU 224 to the reference oscillator 15 as it is. As a result, the reference oscillator 15 operates in accordance with the potential level of the oscillation enabling signal EN. When the third detection signal ER is set high, on the other hand, the AND gate 25 outputs a low-level signal regardless of the potential level of the oscillation enabling signal EN.

As a result, the reference oscillator 15 and oscillation oscillating circuit 221 stop oscillation. This causes the first and second counters 14 and 15 to stop counting to hold the current count values.

The reset control circuit 223 includes an OR gate 23 as shown in FIG. 6. The OR gate 23 receives the third detection signal ER and an external reset signal RST externally supplied via an external terminal T5 of the microcontroller 200. The OR gate 23 logically combines the third detection signal ER and the external reset signal RST to generate an internal reset signal RST1 to be supplied to the CPU 224. The CPU 224 is initialized in response to the internal reset signal RST1.

The external reset signal RST input via the external terminal T5 is supplied also to the first and second counters 14 and 21 and to the first comparator 16. The first and second counters 14 and 21 clear the respective count values in response to the external reset signal RST. The register 21b of the second counter 21 sets the second specified value to zero in response to the external reset signal RST. The register 16a of the first comparator 16 also sets the first specified value to zero in response to the external reset signal RST. In response to the external reset signal RST, the first comparator 16 and the second counter 21 output the first and second detection signals E1 and E2 low, respectively.

The third detection signal ER is also output to outside of the microcontroller 200 via an external terminal T7. The output terminal of the OR gate 22 is connected to an input terminal of the NOR gate 11b of the oscillation circuit 221. Therefore, the oscillation circuit 221 stops its oscillating operation when a high-level third detection signal ER is input thereto.

When power is supplied to the microcontroller 200 described above, the oscillation circuit 221 generates the system clock signal CLK0 in cooperation with the quartz oscillator XTL. The CPU 224 starts to operate based on the system clock CLK0. That is, the CPU 224 sets the predetermined first specified value to the register 16a of the first comparator 16 and the predetermined second specified value to the register 21b of the second counter 21. A case where the first and second specified values are both "5" will now be described below.

The CPU 224 sets data used for setting the frequency of the reference clock signal CLK2 to the frequency selector 43 of the reference oscillator 15. Based on that data, the frequency selector 43 controls the first through fifth transfer gates 40, 41, 42, 47 and 48. In the case described below, the second and fourth transfer gates 40 and 47 are turned on and the first, third and fourth transfer gates 40, 42 and 48 are turned off.

The CPU 224 outputs a high-level oscillation enabling signal EN to the reference oscillator 15. In response to the high-level oscillation enabling signal EN, the reference oscillator 15 generates the reference clock signal CLK2. The frequency of the reference clock signal CLK2 is twice as large as that of the system clock CLK0 in the case described below, as shown in FIG. 7.

Figure 7:
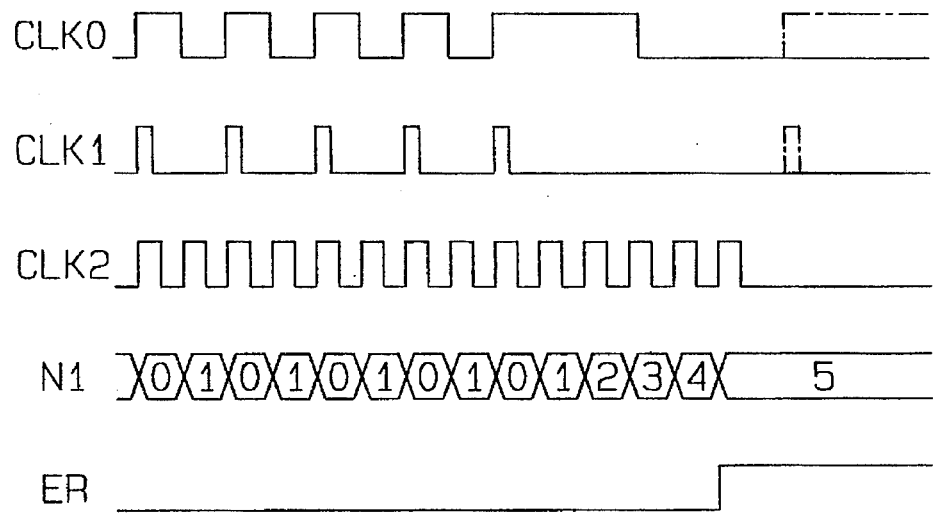
FIGS. 7 and 8 are timing charts for explaining operations of the variant frequency detector circuit of the first embodiment.

As shown in FIG. 7, the edge detector 13 generates a pulse signal CLK1 having leading edges synchronized with leading edges of the system clock CLK0. The first counter 14 receives the reference clock signal CLK2 to count the number of pulses the signal CLK2, and clears the count value N1 in response to the pulse signal CLK1.

At this time, since the frequency of the reference clock signal CLK2 is twice as large as that of the system clock CLK0, the count value N1 is cleared to "0" by the pulse signal CLK1 before the first counter 14 counts two pulses of the reference clock signal CLK2. That is, the count value N1 of the first counter 14 is either "0" or "1" as long as the frequency of the system clock CLK0 is normal or proper.

The signal indicative of the count value N1 is supplied to the first and second comparators 16 and 17. The first comparator 16 compares the count value N1 with the first specified value (i.e. "5"). Because the count value N1 is "0" or "1" when the frequency of the system clock CLK0 is normal, the count value N1 does not coincide with the first specified value. Accordingly, the first comparator 16 outputs a first detection signal E1 low.

The second comparator 17 outputs a signal S1 high when the count value N1 is "0", and outputs the signal S1 low when the count value N1 is "1". In other words, the second comparator 17 outputs the high-level signal S1 every time the first counter 14 is cleared, i.e. every time the reference clock signal CLK2 goes high.

When the signal S1 goes high, the second counter 21 receives the reference clock signal CLK2 as a count clock signal CLK4, and counts the number of pulses of the count clock signal CLK4. When the signal S1 goes low, the second counter 21 receives the reference clock signal CLK2 as a clear signal CLK3, and sets the current count value N2 to zero.

The comparator 21c of the second counter 21 compares the count value N2 with the second specified value (i.e. "5"). Since the count value N1 of the first counter 14 is either "0" or "1" when the frequency of the system clock CLK0 is proper, the count value N2 of the second counter 21 is also set to "0" or "1". Accordingly, the count value N2 does not coincide with the second specified value, and the comparator 21c outputs a second detection signal E2 low.

As described above, when the frequency of the system clock CLK0 is within expected limits, the first and second detection signals E1 and E2 both go low and the third detection signal ER goes low. Accordingly, the oscillation circuit 221 and the reference oscillator 15 continue to oscillate the system clock CLK0 and the reference clock signal CLK2.

Next, a case where the frequency of the system clock CLK0 drops or where the oscillation of the system clock CLK0 stops will now be described with reference to the timing chart in FIG. 7.

When the frequency of the system clock CLK0 drops for some reason, a pulse interval of the pulse signal CLK1 output from the edge detector 13 becomes longer than that during normal operation. When the oscillation of the system clock CLK0 stops, no pulse signal CLK1 is output.

Since the pulse signal CLK1 is used as the clear signal for the first counter 14, a count operation time of one cycle of the first counter 14 is prolonged if the pulse interval is long. In this case, the count value N1 of the first counter 14 may reach the first specified value (i.e. "5") before it is cleared. When the count value N1 reaches the first specified value, the first comparator 16 considers that a decrease in the frequency of the system clock CLK0 is abnormal or improper, and outputs the first detection signal E1 high. In response to the high-level first detection signal E1, the OR gate 22 outputs the third detection signal ER high. As a result, the oscillation circuit 221 and the reference oscillator 15 stop to oscillate the system clock CLK0 and the reference clock signal CLK2.

The high-level third detection signal ER is output to the outside of the microcontroller 200 via the external terminal T7. External equipment or devices can confirm that the frequency of the system clock CLK0 is abnormal based on the high-level detection signal ER. The high-level third detection signal ER is also supplied to the CPU 224 and the peripheral circuit 227 as an internal reset signal RST1 used to reset them.

Figure 8:
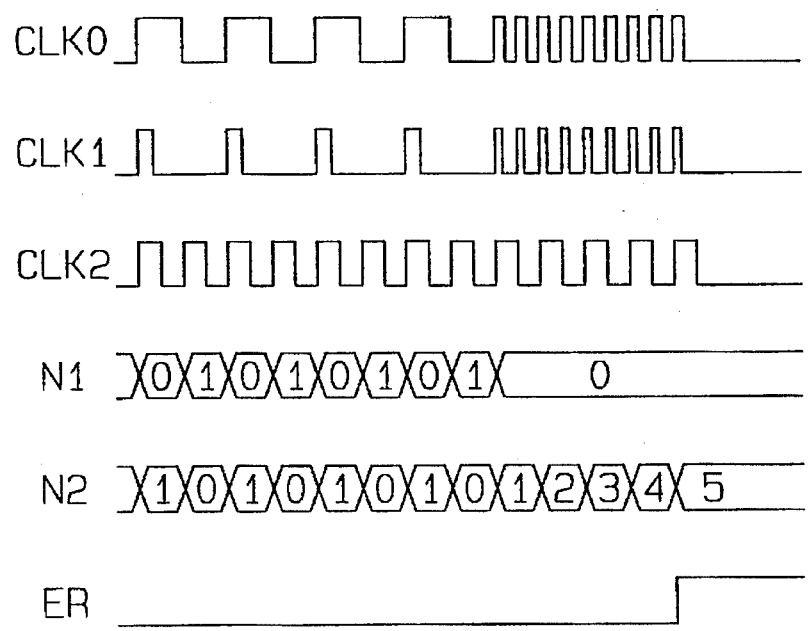

A case where the frequency of the system clock CLK0 has increased will now be described with reference to the timing chart in FIG. 8.

When the frequency of the system clock CLK0 increases for some reason, the pulse interval of the pulse signal CLK1 becomes less than that during normal operation, and less than that of the reference clock signal CLK2. As a result, the first counter 14 is reset before it starts to count the reference clock signal CLK2, and the count value N1 is maintained as "0". Then, the count value N1 does not coincide with the first specified value (i.e. "5"), and the first comparator 16 outputs the first detection signal E1 low.

With the count value N1 zero, the second comparator 17 continues to output the signal S1 low. As long as the signal S1 is set low, the second counter 21 continues to count the number of pulses of the count clock signal CLK4, i.e. the reference clock signal CLK2. When the count value N2 reaches the second specified value (i.e. "5"), the second counter 21 determines that an increase in the frequency of the system clock CLK0 is abnormal, and outputs the second detection signal E2 high.

In response to the high-level second detection signal E2, the OR gate 22 sets the third detection signal ER high. Thus, the oscillation circuit 221 and the reference oscillator 15 stop to oscillate the system clock CLK0 and the reference clock signal CLK2.

The high-level third detection signal ER is output to the outside of the microcontroller via the external terminal T7. The external equipment or devices can confirm that the frequency of the system clock CLK0 is abnormal based on the high-level signal ER. The high-level third detection signal ER is also supplied to the CPU 224 and the peripheral circuit 227 as an internal reset signal RST1 used to reset them.

Next, a case where the oscillation frequency of the system clock CLK0 is changed will now be described. If the oscillation frequency of the system clock CLK0 is changed, the CPU 224 changes the first and second specified values depending on the changed frequency of the system clock CLK0, or changes the oscillation frequency of the reference clock signal CLK2 by rewriting the data in the frequency selector 43 of the reference oscillator 15.

Specifically, when the frequency of the system clock CLK0 is changed to a frequency higher than the present frequency, the CPU 224 changes the setting of the first specified value from "5" to "3" for example. That is, if the frequency of the system clock CLK0 increases with the period of the reference clock CLK2 held constant, the count value N1 of the first counter 14 is less than "5" as long as the frequency of the system clock CLK0 is within expected limits. Even when the frequency of the system clock CLK0 accidentally drops, accordingly, the count value N1 may not reach "5" occasionally. Therefore, the first specified value should be changed from "5" to "3". The CPU 224 sets the second specified value of the register 21b to a greater value in order to avoid an erroneous judgment that the oscillation frequency is abnormal even when it is proper.

When the frequency of the system clock CLK0 is set to a high frequency, the oscillation frequency of the reference clock signal CLK2 may be also increased. In this case, the abnormalities in the oscillation frequency can be detected without changing the first and second specified values.

In contrast, when the frequency of the system clock CLK0 is changed to a lower frequency, the CPU 224 sets the first specified value of the register 16a to a greater value. That is, if the frequency of the system clock CLK0 decreases with the period of the reference clock signal CLK2 held constant, the count value N1 of the first counter 14 exceeds "5" as long as the frequency of the system clock CLK0 is within expected limits. This causes erroneous judgement that the frequency is abnormal. In order to avoid such erroneous judgment, the first specified value is set larger and the second specified value of the register 21b is set smaller.

When the frequency of the system clock CLK0 is set to a lower frequency, the oscillation frequency of the reference clock signal CLK2 may be set low. Then, the abnormalities in the oscillation frequency can be detected without changing the first and second specified values.

As described above, according to the present embodiment, the first counter 14 counts the number of pulses of the reference clock signal CLK2 from the reference oscillator 15, and outputs the count value N1. The count value N1 of the first counter 14 is cleared based on the system clock CLK0. The reference oscillator 15 can change the oscillation frequency of the reference clock signal CLK2 based on the data set by the CPU 224. The first comparator 16 stores the first specified value in its register 16a. The first specified value can be changed by the CPU 224. The second counter 21 stores the second specified value in its register 21b. The second specified value can be changed by the CPU 224. Even when the oscillation frequency of the system clock CLK0 is changed, the frequency detector circuit 222 changes the frequency of the reference clock signal CLK2 of the reference oscillator 15 or changes the first and second specified values, so that the detector circuit 222 can detect the abnormalities in oscillation frequency of the system clock CLK0 at any time.

The variant frequency detector according to the first embodiment can selectively execute either the changing of the frequency of the reference clock signal CLK2 or the changing of the first and second specified values. The present invention may be applied to a frequency detector which is designed to execute only either the changing of the frequency of the reference clock signal CLK2 or the change of the first and second specified values.

Although the reference oscillator 15 of the first embodiment can switch the frequency of the reference clock signal CLK2 over three steps, the reference oscillator 15 may be designed to switch the frequency over two steps or more than four steps. Further, the number of inverters in the reference oscillator 15 may be changed.

The number of flip-flop circuits in each of the first and second counters 14 and 21 in the first embodiment may be changed. In that case, the number of registers 16a and 21b should be changed corresponding to the number of flip-flops.

Although the frequency detector circuit 222 of the first embodiment detects the system clock CLK0 generated by the oscillation circuit 221 incorporated in the microcontroller 200, the detector 222 may be used to detect abnormalities in the frequency of a system clock supplied from the external equipment other than the microcontroller 200.

Each of the registers 16a and 21b of the first embodiment may be formed by a non-volatile memory (e.g. an EEPROM or EPROM). In this case, the frequency detector circuit 222 need not be set with the first and second specified values by the CPU 224 every time power is supplied. The frequency selector 43 of the reference oscillator 15 may be formed by a non-volatile memory device.

Second Embodiment

A microcontroller according to a second embodiment of the present invention will now be described with reference to FIGS. 14 through 19. The second embodiment is essentially the same as the first embodiment described above, except that the circuit configuration of the variant frequency detector in the second embodiment is different from that of the variant frequency detector 222 in the first embodiment. Accordingly, only the variant frequency detector circuit will be explained in detail in this embodiment.

Figure 14:
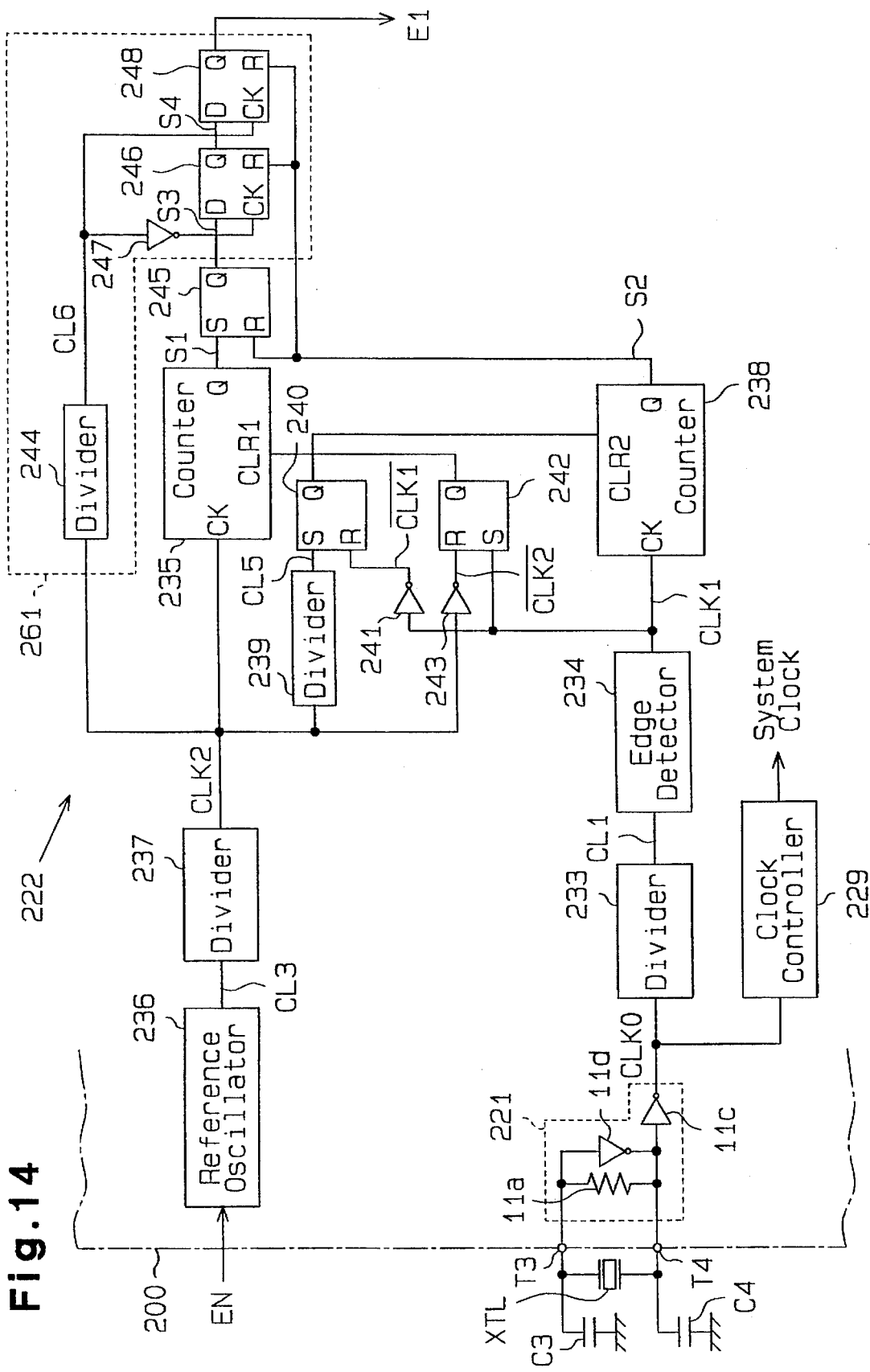
FIG. 14 is a circuit diagram showing a variant frequency detector circuit according to a second embodiment of the present invention.
Figure 17:
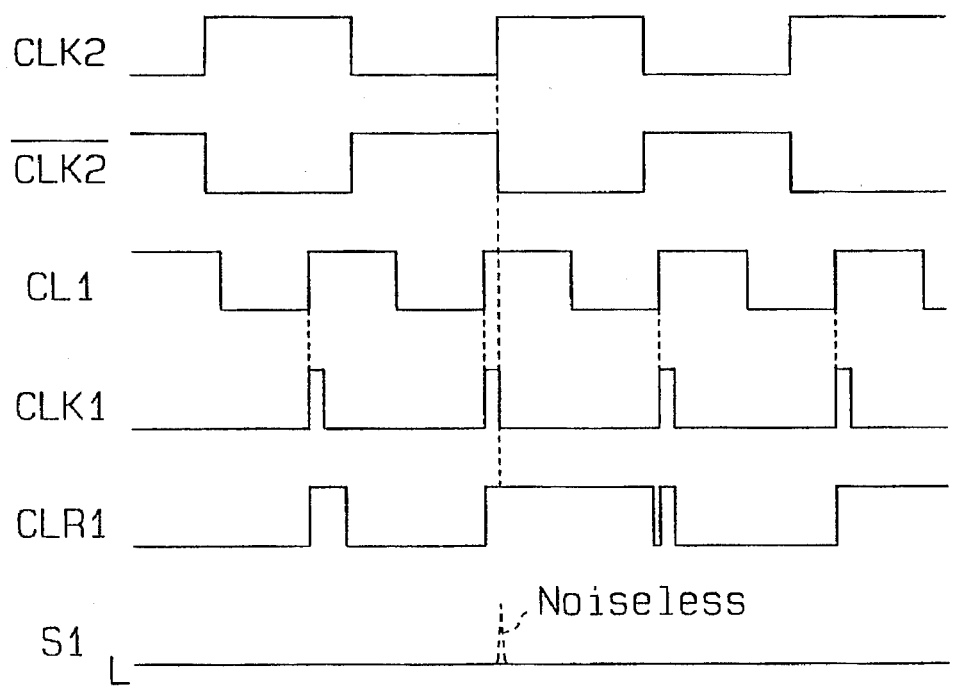
FIGS. 17, 18 and 19 are timing charts for explaining operations of the variant frequency detector circuit of the second embodiment.

FIG. 14 shows circuit configurations of an oscillation circuit 221 and the variant frequency detector circuit 222 according to the second embodiment. The oscillation circuit 221 includes a resistor 11a and two inverters 11c and 11d. In the frequency detector circuit 222, a first frequency divider 233 receives a system clock signal CLK0 from the oscillation circuit 221, and divides the frequency of the system clock CLK0 to generate a pulse signal CL1 as shown in FIG. 17. The pulse signal CL1 is supplied to an edge detector 234.

Figure 15:
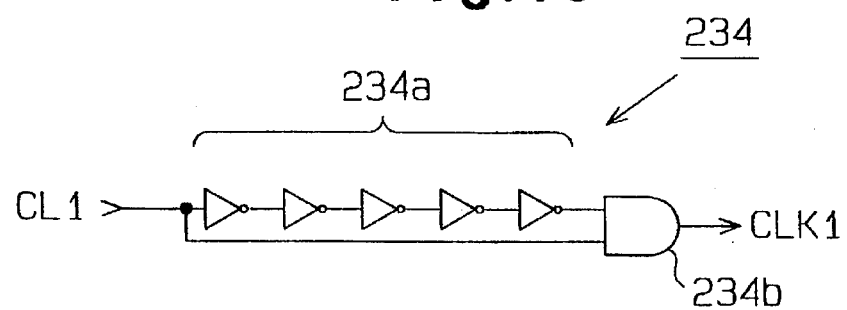
FIG. 15 is a circuit diagram showing an edge detecting circuit of the second embodiment.

FIG. 15 shows the circuit configuration of the edge detector 234. The edge detector 234 includes an AND gate 234b and a delay circuit 234a having an odd number of stages of inverters (five stages in this embodiment) connected in series. The AND gate 234b has a first input terminal for directly receiving the pulse signal CL1 and a second input terminal for receiving the pulse signal CL1 via the delay circuit 234a. The edge detector 234 generates a pulse signal CLK1 in response to a rising of the pulse signal CL1 from low to high. Specifically, when the pulse signal CL1 goes high, the pulse signal CLK1 goes high and goes low after a delay time decided by the delay circuit 234a from the rising of the signal CLK1. The delay time is generally controlled by the number of inverters in the delay circuit 234a.

Figure 16:
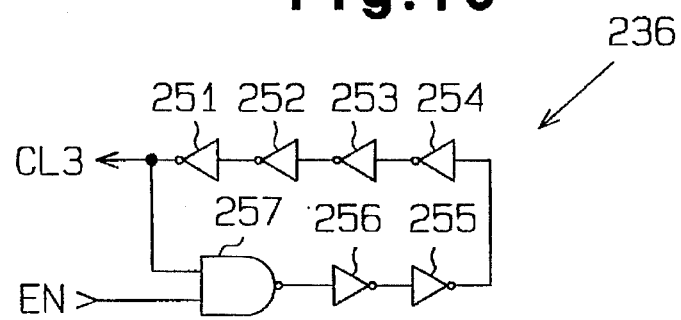
FIG. 16 is a circuit diagram showing a reference oscillator of the second embodiment.

The variant frequency detector circuit 22 includes a reference oscillator 236 which is a ring-type oscillation circuit. FIG. 16 shows the circuit structure of the reference oscillator 236. The reference oscillator 236 includes six inverters 251 through 256 and a NAND gate 257 connected in series. The NAND gate 257 has a first input terminal connected to an output terminal of the inverter 251 and a second input terminal receiving an oscillation enabling signal EN. When the NAND gate 257 receives a high-level oscillation enabling signal EN, the reference oscillator 236 generates a clock signal CL3 at a frequency defined by the inverters 251 through 256 and the NAND gate 257. The clock signal CL3 is supplied to a second frequency divider 237 shown in FIG. 14.

Figure 18:
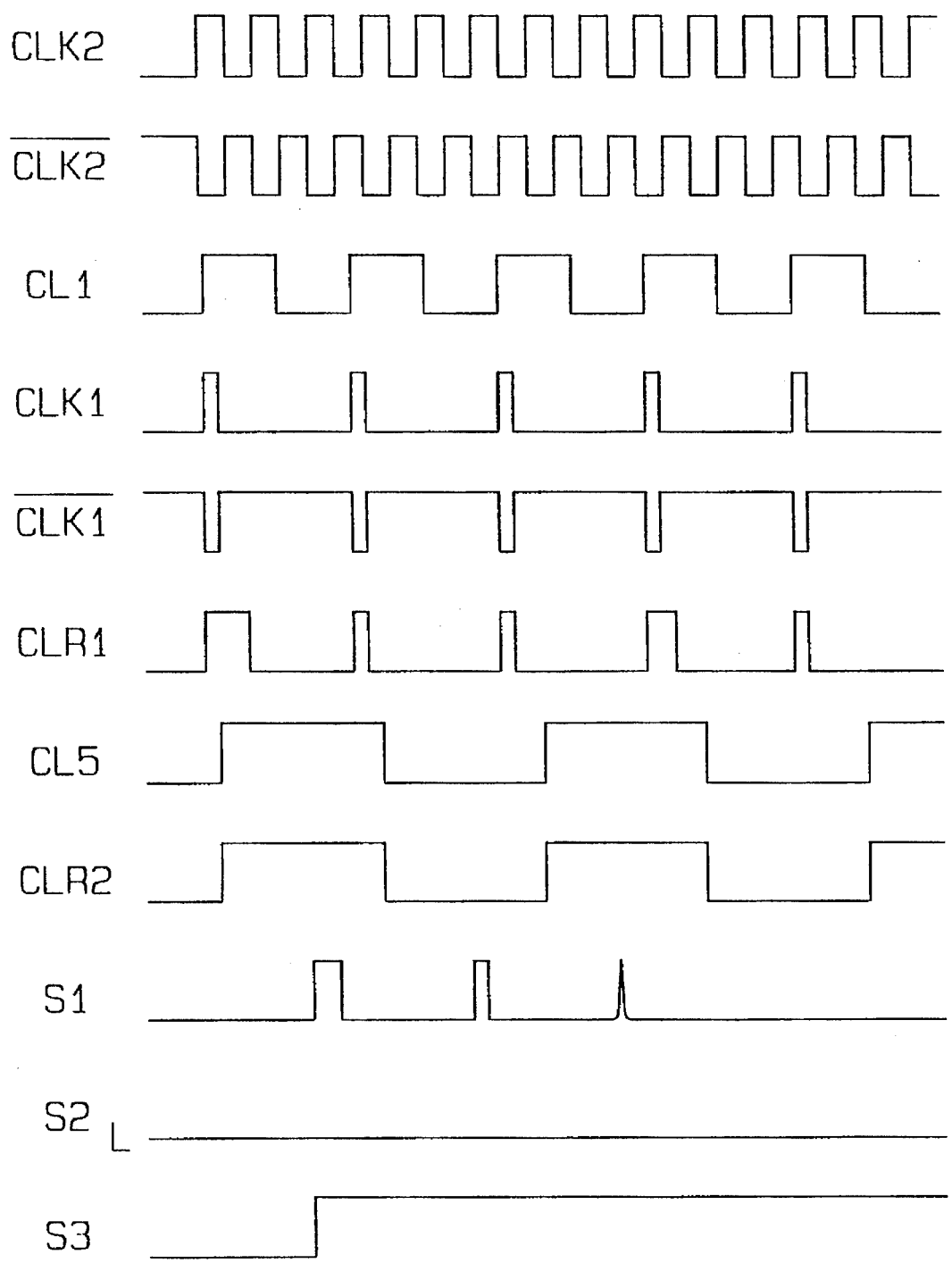

The second frequency divider 237 divides the frequency of the clock signal CL3 with a predetermined dividing ratio to generate a reference clock signal CLK2 as shown in FIG. 17. The reference clock signal CLK2 is supplied to a third frequency divider 239. The third frequency divider 239 divides the frequency of the reference clock signal CLK2 with a predetermined dividing ratio to generate a pulse signal CL5 as shown in FIG. 18.

A first flip-flop circuit 240, provided in the frequency detector circuit 222, has a reset terminal R, a set terminal S and an output terminal Q. The pulse signal CL5 is input to the set terminal S of the first flip-flop 240. The reset terminal R is connected to the edge detector 234 via an inverter 241, and receives a pulse signal /CLK1 produced by the inversion of the pulse signal CLK1.

When the pulse signal CL5 is set high, the first flip-flop 240 outputs a high-level clear signal CLR2 to a counter 238, regardless of the potential level of the pulse signal /CLK1. When the pulse signal CL5 and the signal /CLK1 are both low, the output from the flip-flop 240 maintains the potential level of the previous output signal (i.e., the clear signal CLR2). When the pulse signal CL5 is low and the pulse signal /CLK1 is high, the flip-flop 240 outputs the clear signal CLR2 low. Accordingly, the first flip-flop 240 has a function of delaying the falling of the clear signal CLR2 until the timing of the falling of the pulse signal CLK1, when the falling or trailing edge of the pulse signal CL5 is synchronized with the rising or leading edge of the pulse signal CLK1.

A second flip-flop circuit 242, provided in the variant frequency detector circuit 222, has a reset terminal R, a set terminal S and an output terminal Q. The pulse signal CLK1 output from the edge detector 234 is input to the set terminal S. The reset terminal R is connected to the second frequency divider 237 via an inverter 243, and receives a clock signal /CLK2 produced by the inversion of the reference clock signal CLK2.

When the pulse signal CLK1 is set high, the second flip-flop 242 outputs a high-level clear signal CLR1 to a counter 235, regardless of the potential level of the reference clock signal /CLK2. When the pulse signal CLK1 and the reference clock signal /CLK2 are both low, the output from the flip-flop 242 maintains the level of the previous output signal (i.e. the clear signal CLR1). When the pulse signal CLK1 is low and the reference clock signal /CLK2 is high, the flip-flop 242 outputs the clear signal CLR1 low. Accordingly, the second flip-flop 242 has a function of delaying the falling of the clear signal CLR1 until the timing of the falling of the reference clock signal CLK2, when the trailing edge of the pulse signal CLK1 is synchronized with the leading edge of the reference clock signal CLK2.

The counter 235 is provided to detect whether a decrease in the oscillation frequency of the system clock CLK0 is abnormal or improper. The counter 235 receives the reference clock signal CLK2 and the clear signal CLR1. With the clear signal CLR1 high, the counter 235 clears the current count value. With the clear signal CLR1 low, the count clearing is releases so that the counter 235 restart to count the number of the rising edges of the reference clock signal CLK2. When the count value reaches a predetermined specified value, the counter 235 outputs a high-level detection signal S1 indicating that the frequency of the system clock CLK0 is abnormal to a third flip-flop circuit 245. When the frequency of the system clock CLK0 is within expected limits, the counter 235 can receive a high-level clear signal CLR1 before the count value reaches to the specified value. Therefore, as long as the oscillation frequency of the system clock CLK0 is within expected limits, the counter 235 will not output the detection signal S1 high.

Another counter 238 is provided to detect whether the oscillation frequency of the system clock CLK0 has returned from an unexpected low frequency to an expected normal frequency. The counter 238 receives the pulse signal CLK1 and the clear signal CLR2. With the clear signal CLR2 high, the counter 238 clears the current count value. With the clear signal CLR2 low, the count clearing is released so that the counter 238 restarts to count the number of leading edges of the pulse signal CLK1. When the count value reaches a specified value, the counter 238 outputs a high-level return signal S2 indicating that the frequency of the system clock CLK0 has returned to an expected normal frequency.

Specifically, if the oscillation frequency of the system clock CLK0 is within expected limits, the counter 238 will receive a high-level clear signal CLR2 after the count value has reached the specified value. If the oscillation frequency of the system clock CLK0 drops below an expected minimum frequency, the counter 238 will receive a high-level clear signal CLR2 before the count value reaches the specified value. Therefore, the counter 238 will not output the return signal S2 high when a decrease in the frequency of the system clock CLK0 is abnormal.

Even if the counter 235 detects that the oscillation frequency is abnormally low, the specified value in the return detecting counter 238 is selected so that the frequency of the system clock CLK0 does not return to a normal frequency before the detected frequency by the counter 235 returns to a predetermined frequency.

The third flip-flop circuit 245 has a reset terminal R, a set terminal S and an output terminal Q. The set terminal S receives the detection signal S1 from the abnormality detecting counter 235. The reset terminal R receives the return signal S2 from the return detecting counter 238. With the detection signal S1 high, the flip-flop 245 outputs a signal S3 high, regardless of the potential level of the return signal S2. With the detection signal S1 and the return signal S2 both low, the flip-flop 245 maintains the potential level of the previous output signal (i.e., signal S3). With the detection signal S1 low and with the return signal S2 high, the flip-flop 245 outputs the signal S3 low. In other words, the third flip-flop 245 continues to output the signal S3 high during the period of time from the input of the high-level detection signal S1 to the subsequent input of the next high-level return signal S2. Thus, the third flip-flop 245 and the return detecting counter 238 form a stabilizing circuit.

The variant frequency detector circuit 222 includes a judging circuit section 261. The judging circuit section 261 includes a fourth frequency divider 244, two synchronous delay flip-flop circuits 246 and 248 and an inverter 247. The judging circuit section 261 intermittently judges the abnormalities in the frequency of the system clock CLK0.

Figure 19:
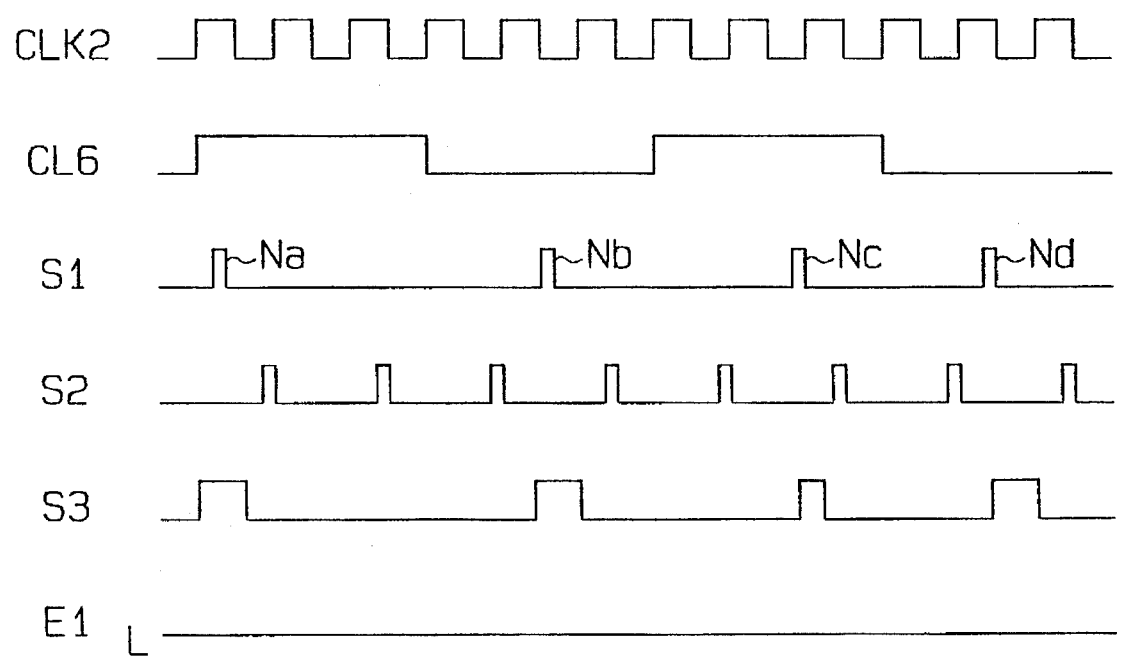

The fourth frequency divider 244 divides the frequency of the reference clock signal CLK2 with a predetermined dividing ratio to generate a signal CL6 as shown in FIG. 19.

The flip-flop circuit 246 has a data terminal D, a reset terminal R, a clock terminal CK and an output terminal Q. The data terminal D receives the signal S3 from the third flip-flop circuit 245. The reset terminal R receives the return signal S2. The clock terminal CK receives a pulse signal /CL6 produced by the inversion of the pulse signal CL6 from the divider 244. In synchronism with the falling of the pulse signal CL6, the flip-flop 246 outputs an output signal S4 based on the output signal S3 and on the return signal S2.

The flip-flop circuit 248 has a data terminal D, a reset terminal R, a clock terminal CK and an output terminal Q. The data terminal D receives the signal S4. The reset terminal R receives the return signal S2. The clock terminal CK receives the pulse signal CL6 from the fourth frequency divider 244. In synchronism with the rising of the pulse signal CL6, the flip-flop 248 outputs a detection signal E1 based on the output signal S4 and on the return signal S2.

Accordingly, the judging circuit section 261 judges the abnormalities in the frequency of the system clock CLK0 with a period of one pulse of the pulse signal CL6. As a result, the detection signal E1 output from the judging circuit section 261 is stabilized.

When the power is supplied to the microcontroller 200 of the second embodiment, the oscillation circuit 221 generates a system clock CLK0 in cooperation with the quartz oscillator XTL, and the reference oscillator 236 starts to generate a clock signal CL3 in response to a high-level oscillation enabling signal EN from the CPU 224 shown in FIG. 5. The edge detector 234 generates the pulse signal CLK1 synchronized with the leading edges of the pulse signal CL1 from the first frequency divider 233, as shown in FIG. 17.

The first flip-flop circuit 240 outputs the clear signal CLR2 high, in response to the rising edge of the pulse signal CL5. When the pulse signal CLK1 is set high with the pulse signal CL5 low, the flip-flop circuit 240 maintains the output of the high-level clear signal CLR2 until the pulse signal CLK1 goes low. When the pulse signal CL5 goes low after outputting the clear signal CLR2 high, and when the pulse signal CLK1 is set low, the flip-flop 240 continues to output the clear signal CLR2 high until the pulse signal CL5 goes low.

The second flip-flop circuit 242 outputs the clear signal CLR1 high, in response to the leading edge of the pulse signal CLK1. When the reference clock signal CLK2 goes high with the pulse signal CLK1 low, the flip-flop 242 maintains the output of the high-level clear signal CLR1 until the reference clock signal CLK2 goes low. When the pulse signal CLK1 goes low after outputting the clear signal CLR1 high, and when the reference clock signal CLK2 goes low, the flip-flop 242 continues to output the high-level clear signal CLR1 until the pulse signal CLK1 goes low.

The abnormality detecting counter 235 clears its count value while the clear signal CLR1 is set high. When the clear signal CLR1 goes low, the count clearing is released so that the counter 235 restarts to count the reference clock signal CLK2. When the count value reaches to the specified value, the counter 235 outputs the detection signal S1 high.

The return detecting counter 238 clears its count value while the clear signal CLR2 is set high. When the clear signal CLR2 goes low, the count clearing is released so that the counter 238 restarts to count the pulse signal CLK1. When the count value reaches to the specified value, the counter 238 outputs the detection signal S2 high.

As shown in the timing chart in FIG. 17, occasionally, the falling of the pulse signal CLK1 may be synchronized with the rising of the reference clock signal CLK2. Even in this case, the clear signal CLR1 output from the second flip-flop circuit 242 is held at the high-level until the falling of the reference clock signal CLK2, so that the abnormality detecting counter 235 is in a reset state produced by the clear signal CLR1. Therefore, the frequency detector of this embodiment prevents the generation of counter noise as generated by the counter of the conventional frequency detector circuit. As a result, the variant frequency detector circuit 222 of this embodiment does not erroneously detect the abnormalities in the frequency of the system clock CLK0.

When the frequency of the system clock CLK0 decreases for some reason, the frequencies of the pulse signals CL1 and CLK1 also decrease as shown in FIG. 18. Then, the time interval during which the clear signal CLR1 is set high is prolonged. As a result, the count value of the number of pulses of the reference clock signal CLK2 reaches to the specified value, and the counter 235 outputs the detection signal S1 high. The detection signal S1 is reset low every time the high-level first clear signal CLR1 is supplied to the counter 235.

At this time, if the return detecting counter 238 outputs a low-level return signal S2 due to receiving the high-level clear signal CLR2, the output signal S3 of the third flip-flop 245 goes high as soon as the detection signal S1 goes high. This allows the potential level of the detection signal S1 to be held stably. In other words, as long as the return signal S2 does not go high, the frequency of the system clock CLK0 does not return to the normal frequency within expected limits.

As shown in the timing chart in FIG. 18, the pulse length of the detection signal S1 changes in accordance with the phase difference between the phase of the reference clock signal CLK2 and the phase of the pulse signal CL1. As long as the return signal S2 is held low, however, it is not judged that the frequency of the system clock CLK0 has returned to the normal value. In this embodiment, the frequency, used by the counter 235 to judge abnormalities in oscillation frequency, differs from the frequency used to judge whether the oscillation frequency has returned to the normal frequency.

When a portion of the pulses of the system clock CLK0 are obscured or omitted, high level external noises Na, Nb, Nc and Nd as shown in the timing chart in FIG. 19 may ride on the detection signal S1 output from the counter 235. In this case, with the supply of the return signal S2 which periodically goes high, the output signal S3 of the third flip-flop circuit 245 goes high during the period of time from the rising of the detection signal S1 to the rising of the return signal S2.

In response to the falling of the pulse signal CL6, the flip-flop circuit 246 maintains the output in accordance with the potential levels of the output signal S3 and the return signal S2. In response to the rising of the pulse signal CL6, the flip-flop circuit 248 maintains the output in accordance with the potential levels of the output signal S4 and the return signal S2. Accordingly, the judging circuit section 261 judges the abnormalities in the frequency of the system clock CLK0 intermittently with the time interval corresponding to one pulse of the signal CL6. This allows the detection signal E1 to be stabilized.

The frequency of the reference clock signal CL3 generated by the reference oscillator 236 may be changeable, like the first embodiment.

Further, each specified value in the counters 235 and 236 may be changeable. The logic of the count signal and clear signal of the counter 235 and the counter 238 may be negative logic.

The system clock signal CLK0 may be externally supplied to the microcontroller 200, instead of generating the clock CLK0 in the microcontroller 200. It is possible to externally supply reference clock signal CL3 to the microcontroller 200, without generating the signal CL3 in the reference oscillator 236 of the microcontroller 200.

Although only two embodiments of the present invention have been described herein, it will be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. A variant frequency detector circuit for detecting abnormalities in the frequency of a detected clock signal, comprising:

a first counter, supplied with a reference clock signal, for counting the number of pulses of the reference clock signal and for outputting a signal indicative of the count value, said first counter being responsive to said detected clock signal for clearing the count value;

a comparator provided with a memory circuit for storing a first specified value, said comparator comparing the count value of said first counter with said first specified value to generate a detection signal indicating whether the frequency of the detected clock signal is within expected limits; and a reference oscillator for generating the reference clock signal at a predetermined oscillation frequency, wherein said reference oscillator is coupled to a signal derived from the detection signal output from said comparator, and stops or restarts oscillating operation in response to said derived signal.

2. The variant frequency detector circuit according to claim 1, wherein said reference oscillator includes a frequency selector for storing data concerning the frequency of said reference clock signal and for controlling the frequency of the reference clock signal generated by said reference oscillator.

3. The variant frequency detector circuit according to claim 1, wherein said memory circuit of said comparator includes a register.

4. The variant frequency detector circuit according to claim 1 further comprising a second counter for counting the number of pulses of said reference clock signal and for outputting a signal indicative of the count value, said second counter counting the number of pulses of the reference clock signal when the count value of said first counter is cleared, and clearing its own count value when said first counter performs the counting of said reference clock signal.

5. The variant frequency detector circuit according to claim 4, wherein said second counter includes:

a main counter circuit for counting the number of pulses of the signal input to said second counter;

a register for memorizing a second specified value; and a comparator circuit for comparing the count value of said main counter circuit with said second specified value to output a signal based on the comparison result.

6. A variant frequency detector circuit for detecting abnormalities in the oscillation frequency of a detected clock signal, comprising:

a reference oscillator for generating a reference clock signal, said reference oscillator including a frequency selector for storing data concerning the frequency of the reference clock signal and for controlling the frequency of the reference clock signal generated by said reference oscillator;

a counter, coupled to said reference oscillator, for counting the number of pulses of said reference clock signal and for outputting a signal indicative of the count value, said first counter clearing the count value in response to said detected clock signal; and a comparator, coupled to said counter, for comparing the count value of said counter with a predetermined value, said comparator generating a detection signal indicating that the frequency of the detected clock signal is not within expected limits when the count value reaches to the predetermined value;

wherein said reference oscillator is coupled to a signal derived from the detection signal output from said comparator, and stops and restarts oscillating operation in response to said derived signal.

7. A variant frequency detector circuit for detecting abnormalities in the frequency of a clock signal, comprising:

a first counter supplied with a reference clock signal and a first clear signal, said first counter starting to count the number of pulses of said reference clock signal in response to an inactive first clear signal, and stopping the counting operation to clear the count value in response to an active first clear signal, wherein when the count value reaches a predetermined value, said first counter outputs a detection signal indicating that the frequency of the clock signal to be detected is not within expected limits; and a first clear signal generating circuit, supplied with said reference clock signal and a first pulse signal that is based on the clock signal to be detected, for generating the first clear signal, said first clear signal being active when a first edge of a pulse of said reference clock signal is synchronized with a trailing edge of a pulse of said first pulse signal.

8. The variant frequency detector circuit according to claim 7, wherein said first clear signal generating circuit delays the timing at which said first clear signal is switched from active to inactive till the appearance of a second edge of the pulse of said reference clock signal.

9. The variant frequency detector circuit according to claim 7, wherein said first clear signal generating circuit includes a flip-flop circuit having a set terminal for receiving said first pulse signal based on the clock signal to be detected, a reset terminal for receiving said reference clock signal and an output terminal for outputting said first clear signal.

10. The variant frequency detector circuit according to claim 7, further comprising a reference oscillator responsive to an externally supplied oscillation enabling signal for generating the reference clock signal at a predetermined oscillation frequency.

11. The variant frequency detector circuit according to claim 7, further comprising:

a second counter supplied with said first pulse signal based on the clock signal to be detected and a second clear signal, said second counter starting to count the number of pulses of said first pulse signal in response to an inactive second clear signal, and stopping the counting operation to clear the count value in response to an active second clear signal, wherein when the count value reaches to a predetermined value, said second counter outputting a return signal indicating that the frequency of the clock signal to be detected has returned to an expected normal frequency;

a second clear signal generating circuit, supplied with the first pulse signal that is based on the clock signal to be detected and a second pulse signal that is based on said reference clock signal, for generating said second clear signal, wherein when a trailing edge of a pulse of said second pulse signal is synchronized with a first edge of the pulse of said first pulse signal, said second clear signal generating circuit delaying the timing at which the second clear signal is switched from active to inactive till the appearance of a second edge of the pulse of said first pulse signal; and an output holding circuit, supplied with the detection signal from said first counter and the return signal from said second counter, for maintaining an output potential level of the detection signal during a period of time from the input of said detection signal to the input of said return signal.

12. The variant frequency detector circuit according to claim 11, wherein said second clear signal generating circuit includes a flip-flop circuit having a set terminal for receiving the reference clock signal, a reset terminal for receiving the first pulse signal based on the clock signal to be detected and an output terminal for outputting said second clear signal.

13. The variant frequency detector circuit according to claim 11, wherein said output holding circuit includes a flip-flop circuit.

14. The variant frequency detector circuit according to claim 11, further comprising a judging circuit, supplied with an output signal from said output holding circuit and with the reference clock signal, for intermittently detecting abnormalities in the frequency of the clock signal to be detected.

* * * * *